(12) United States Patent
Chiba et al.

(10) Patent No.: US 9,824,919 B2
(45) Date of Patent: Nov. 21, 2017

(54) RECESS FILLING METHOD AND PROCESSING APPARATUS

(71) Applicant: TOKYO ELECTRON LIMITED, Minato-ku, Tokyo (JP)

(72) Inventors: Yoichiro Chiba, Nirasaki (JP); Daisuke Suzuki, Nirasaki (JP); Atsushi Endo, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/450,595

(22) Filed: Mar. 6, 2017

(65) Prior Publication Data

US 2017/0256450 A1 Sep. 7, 2017

(30) Foreign Application Priority Data

Mar. 7, 2016 (JP) .................... 2016-043021

(51) Int. Cl.
*H01L 21/4763* (2006.01)
*H01L 21/768* (2006.01)
*C23C 16/24* (2006.01)
*C23C 16/06* (2006.01)
*C23C 16/02* (2006.01)
*C23C 16/46* (2006.01)
*C23C 16/458* (2006.01)
*C23C 16/455* (2006.01)
*C23C 16/04* (2006.01)
*C23C 16/44* (2006.01)

(52) U.S. Cl.
CPC .... *H01L 21/76879* (2013.01); *C23C 16/0227* (2013.01); *C23C 16/045* (2013.01); *C23C 16/06* (2013.01); *C23C 16/24* (2013.01); *C23C 16/4412* (2013.01); *C23C 16/455* (2013.01); *C23C 16/458* (2013.01); *C23C 16/46* (2013.01); *H01L 21/76843* (2013.01); *H01L 21/76861* (2013.01); *H01L 21/76876* (2013.01)

(58) Field of Classification Search
CPC ................ H01L 21/76879; C23C 16/0227
USPC ......................................... 438/618
See application file for complete search history.

(56) References Cited

U.S. PATENT DOCUMENTS

2006/0292719 A1* 12/2006 Lochtefeld ........ H01L 21/02381
438/22
2008/0119031 A1* 5/2008 Pal ..................... H01L 29/7848
438/483

(Continued)

FOREIGN PATENT DOCUMENTS

JP 2008071814 A 3/2008

*Primary Examiner* — Caleb Henry
(74) *Attorney, Agent, or Firm* — Nath, Goldberg & Meyer; Jerald L. Meyer (57) ABSTRACT

There is provided a method of filling a recess with a germanium-based film composed of germanium or silicon germanium in a substrate to be processed on which an insulating film having the recess formed therein is formed, the method including: forming a silicon film on a surface of the insulating film at a thickness as not to completely fill the recess; subsequently, etching the silicon film such that the silicon film remains only in a bottom portion of the recess; and subsequently, selectively growing the germanium-based film composed of germanium or silicon germanium on the silicon film remaining in the bottom portion of the recess and selectively filling the recess with the germanium-based film.

12 Claims, 4 Drawing Sheets

(56) References Cited

U.S. PATENT DOCUMENTS

| | | | |
|---|---|---|---|
| 2010/0213511 A1* | 8/2010 | Lochtefeld | H01L 21/02647 257/190 |
| 2010/0289116 A1* | 11/2010 | Lin | H01L 21/02381 257/510 |
| 2011/0037133 A1* | 2/2011 | Su | H01L 31/03528 257/432 |
| 2011/0084308 A1* | 4/2011 | Loh | H01L 21/02381 257/190 |
| 2011/0201164 A1* | 8/2011 | Chung | H01L 21/823807 438/229 |
| 2012/0032234 A1* | 2/2012 | Wang | H01L 21/02381 257/200 |
| 2016/0181099 A1* | 6/2016 | Mukherjee | H01L 21/02381 257/190 |

* cited by examiner

RECESS FILLING METHOD AND PROCESSING APPARATUS

CROSS-REFERENCE TO RELATED APPLICATION

This application claims the benefit of Japanese Patent Application No. 2016-043021, filed on Mar. 7, 2016, in the Japan Patent Office, the disclosure of which is incorporated herein in its entirety by reference.

TECHNICAL FIELD

The present disclosure relates to a method of filling a recess with a germanium-based film composed of germanium or silicon germanium in a substrate to be processed on which an insulating film having the recess formed therein is formed, and a processing apparatus using the same.

BACKGROUND

In recent years, a high-speed operation of a semiconductor integrated circuit device is in demand Such a high-speed operation mainly requires a reduction in size of a semiconductor device such as a transistor, a reduction in resistance of a wiring, and a reduction in dielectric constant of an interlayer dielectric layer. However, the high-speed operation based on such approaches has limitations.

As such, in order to realize further high-speed operation, silicon germanium (SiGe) or germanium (Ge) that is a semiconductor material having a higher carrier mobility is getting a lot of attention, instead of silicon (Si) as a semiconductor material used previously.

Such a Ge or SiGe is under consideration as a material for filling, as a Ge film or a SiGe film, a recess such as a trench or hole, which is formed in an insulating film such as a $SiO_2$ film, a SiN film or the like, by a chemical vapor deposition (CVD) method.

However, a germanium-based film such as the Ge film or the SiGe film is known to have a high selectivity to an underlying film. In a case where the germanium-based film is formed on the insulating film, a silicon material such as amorphous silicon has been considered to be used as a seed. However, the conventional method allows the germanium-based film to grow over the entire area even if a recess such as a trench or hole needs to be selectively filled. As such, the germanium-based film may be formed even on an unintended area other than the recess.

SUMMARY

Some embodiments of the present disclosure provide a method of selectively filling a recess formed in an insulating film with a germanium-based film, and a processing apparatus using the same.

According to one embodiment of the present disclosure, there is provided a method of filling a recess with a germanium-based film composed of germanium or silicon germanium in a substrate to be processed on which an insulating film having the recess formed therein is formed, the method including: forming a silicon film on a surface of the insulating film at a thickness as not to completely fill the recess; subsequently, etching the silicon film such that the silicon film remains only in a bottom portion of the recess; and subsequently, selectively growing the germanium-based film composed of germanium or silicon germanium on the silicon film remaining in the bottom portion of the recess and selectively filling the recess with the germanium-based film.

According to another embodiment of the present disclosure, there is provided a processing apparatus of filling a recess with a germanium-based film composed of germanium or silicon germanium in a substrate to be processed on which an insulating film having the recess formed therein is formed, the apparatus including: a processing container configured to receive the substrate to be processed; a gas supply part configured to supply a predetermined gas into the processing container; a heating mechanism configured to heat an interior of the processing container; an exhaust mechanism configured to exhaust the interior of the processing container to reduce an internal pressure of the processing container; and a control part configured to control the gas supply part, the heating mechanism and the exhaust mechanism, wherein the control part controls the exhaust mechanism to reduce the internal pressure of the processing container to a predetermined pressure; controls the heating mechanism to keep the interior of the processing container at a predetermined temperature; controls the gas supply part to supply a silicon-raw material gas into the processing container such that a silicon film is formed on a surface of the insulating film at a thickness as not to completely fill the recess; subsequently, controls the gas supply part to supply an etching gas into the processing container to etch the silicon film such that the silicon film remains only in a bottom portion of the recess; and subsequently, controls the gas supply part to supply a germanium-raw material gas or a combination of the germanium-raw material gas and the silicon-raw material gas into the processing container such that the germanium-based film composed of germanium or silicon germanium selectively grows on the silicon film that remains in the bottom portion of the recess.

According to yet another embodiment of the present disclosure, there is provided a non-transitory computer-readable storage medium storing a program that operates on a computer and controls a processing apparatus, wherein the program, when executed, causes the computer to control the processing apparatus so as to perform the aforementioned method.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Hereinafter, the embodiments of the present disclosure will be described with reference to the accompanying drawings. Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

<Recess Filling Method>

Figure 1:
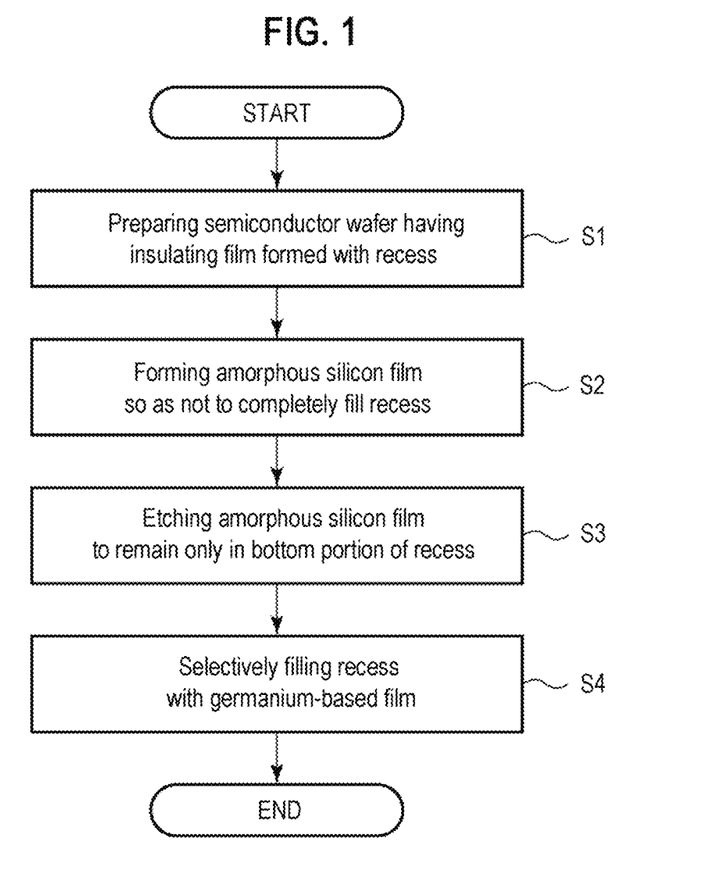
FIG. 1 is a flowchart showing a recess filling method according to an embodiment of the present disclosure.

Now, an embodiment of a recess filling method according to the present disclosure will be described with reference to a flowchart of FIG. 1 and cross-sectional process views of FIGS. 2A to 2D.

First, a semiconductor wafer (hereinafter, simply referred to as a wafer) is provided in which an insulating film 201 formed of a $SiO_2$ film, a SiN film or the like is on a semiconductor base 200. In the insulating film 201, there is formed a recess 202 such as a trench or hole in a predetermined pattern (Step S1, FIG. 2A).

Figure 2A:
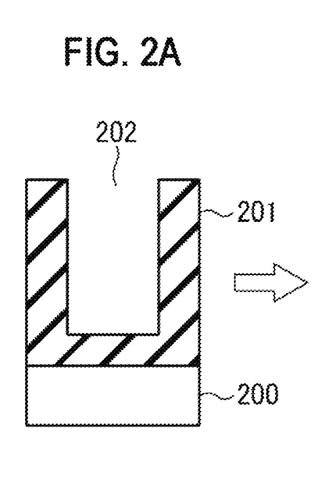
FIGS. 2A to 2D are cross-sectional process views to explain a recess filling method according to an embodiment of the present disclosure.

For example, the recess 202 may have an opening diameter or width of about 10 to 50 nm and a depth of about 50 to 300 nm.

Figure 2B:
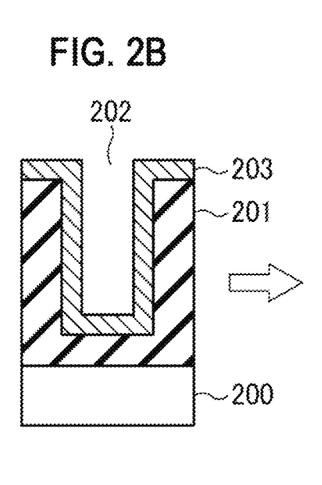

Subsequently, a silicon film, typically an amorphous silicon film 203 is formed (deposited) on the insulating film 201 to the extent that the recess 202 is not wholly filled with the amorphous silicon film 203 (Step S2, FIG. 2B). At this time, the amorphous silicon film 203 is formed by a CVD method using a silicon (Si)-raw material gas. A thickness of the amorphous silicon film 203 depends on a size and the shape of the respective recess, and may be about 10 to 20 nm.

All Si-containing compounds to which the CVD method is applicable may be used as the Si raw material gas but not particularly limited. For example, silane-based compounds and amino-silane-based compounds may be used as the Si raw material gas. Examples of the silane-based compounds may include monosilane ($SiH_4$), disilane ($Si_2H_6$) or the like. Examples of the amino-silane-based compounds may include BAS (butyl-amino-silane), BTBAS (bistert-butyl-amino-silane), DMAS (dimethyl-amino-silane), BDMAS (bisdimethyl-amino-silane), or the like. Of course, other silane-based gases or other amino-silane-based gases may be used.

Specific process conditions applied at this time may be as follows: a wafer temperature is 300 to 700 degrees C. and a pressure is 0.1 to 10 Torr (13.3 to 1,333 Pa).

Figure 2C:
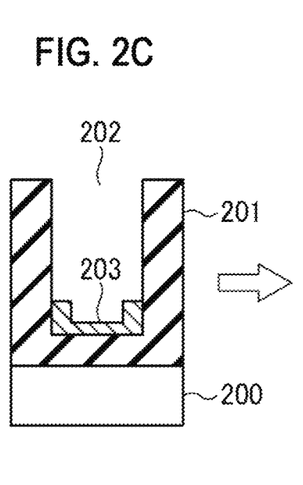

Subsequently, an etching gas is supplied onto the wafer to etch the amorphous silicon film 203 such that the amorphous silicon film 203 remains only in the bottom portion of the recess 202 (Step S3, FIG. 2C).

The etching gas is supplied from the top. As such, the amorphous silicon film 203 is etched from the surface thereof. Accordingly, as shown in FIG. 2C, an upper portion of the amorphous silicon film 203 and a lateral portion of the recess 202 are completely etched to expose the insulating film 201. In this way, the amorphous silicon film 203 may remain only in the bottom portion of the recess 202 to have a V-shape or U-shape.

As the etching gas used at this time, all gases may be used as long as they can etch the amorphous silicon. However, such gases are not particularly limited. For example, $Cl_2$, HCl, $F_2$, $Br_2$, HBr, or the like may be used as the etching gas. In some embodiments, other etching processes of removing silicon may be used in addition to an etching process using the etching gases, or instead of such an etching process, At this time, an etching temperature may be in the range of 200 to 500 degrees C. In this case, as the etching temperature increases within this range (400 degrees C. or more), the amorphous silicon film tends to become easier to remain in the bottom portion.

Figure 2D:
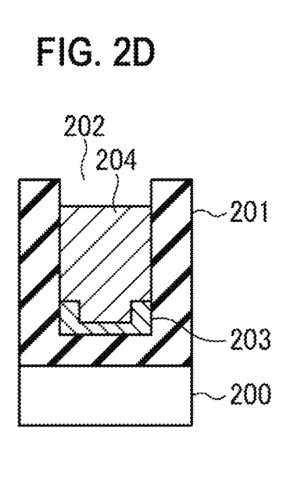

Thereafter, a germanium-based film 204 made of germanium (Ge) or silicon germanium (SiGe) is formed (deposited) to selectively fill the recess 202 with the germanium-based film 204 (Step S4, FIG. 2D).

At this time, in the case where the germanium-based film 204 is a Ge film, the germanium-based film 204 is formed by a CVD method using a Ge raw material gas. In the case where the germanium-based film 204 is a SiGe film, the germanium-based film 204 is formed by a CVD method using both the Ge raw material gas and a Si raw material gas. In the case where the germanium-based film 204 is the SiGe film, the percentage of Si may be about 70 at % or more.

The germanium-based film 204 made of Ge or SiGe is not formed on an insulating film but is formed on silicon. Thus, the germanium-based film 204 is not formed on the exposed surface portion of the insulating film 201 or on the lateral portion of the recess 202, whereas the germanium-based film 204 is selectively formed only on the amorphous silicon film 203 existing in the bottom portion of the recess 202. This makes it possible for the germanium-based film 204 to undergo a bottom-up growth from the bottom portion of the recess 202, thus selectively filling the inside of the recess 202.

All Ge-containing compounds to which the CVD method is applicable may be used as the Ge raw material gas but not particularly limited. For example, germane-based compounds and amino-germane-based compounds may be used as the Ge raw material gas. Examples of the germane-based compounds may include mono-germane ($GeH_4$), di-germane ($Ge_2H_6$), or the like. Examples of the amino-germane-based compounds may include tris-dimethyl-amino-germane ($GeH(NMe_2)_3$), dimethyl-amino-germane ($GeH_3(NMe_2)_2$), bis-dimethyl-amino-germane ($GeH_2(NMe_2)_2$), or the like. Furthermore, other germane-based gases and other amino-germane-based gases may be used.

Like the case of forming the amorphous silicon film 203 described above, the Si raw material gas used in forming a SiGe film may include all Si-containing compounds to which the CVD method is applicable but not particularly limited. As an example, silane-based compounds and amino-silane-based compounds may be used.

An example of specific process conditions used at this time is as follows: a wafer temperature is about 200 to 500 degrees C. and a pressure is about 0.1 to 10 Torr (13.3 to 1,333 Pa).

In some embodiments, the germanium-based film 204 may fill the recess 202 up to the top surface thereof. Alternatively, in the case where a cap layer is formed in a subsequent process, the germanium-based film 204 may fill the recess 202 up to a position lower than the top surface thereof.

The germanium-based film 204 filled in the recess 202 is amorphous. Thus, after the aforementioned process is completed, the germanium-based film 204 is subjected to a crystallization process.

As described above, according to the present embodiment, the amorphous silicon film 203 is formed on the wafer in which the recess 202 such as a trench or hole is formed in the insulating film 201 to the extent that the amorphous silicon film 203 does not completely fill the recess 202.

Thereafter, the amorphous silicon film 203 is etched by an etching gas such that the amorphous silicon film 203 remains only in the bottom portion of the recess 202. In such a state, when the germanium-based film 204 made of Ge or SiGe is formed, the germanium-based film 204 is selectively formed only on the amorphous silicon film 203 in the bottom portion so that the germanium-based film 204 can undergo the bottom-up growth from the bottom portion. Therefore, the recess 202 can be selectively filled with the germanium-based film 204. In addition, the bottom-up growth makes it possible to fill the recess 202 with the germanium-based film 204 without voids, even in the recess 202 is formed in a fine shape.

<Example of Processing Apparatus>

Figure 3:
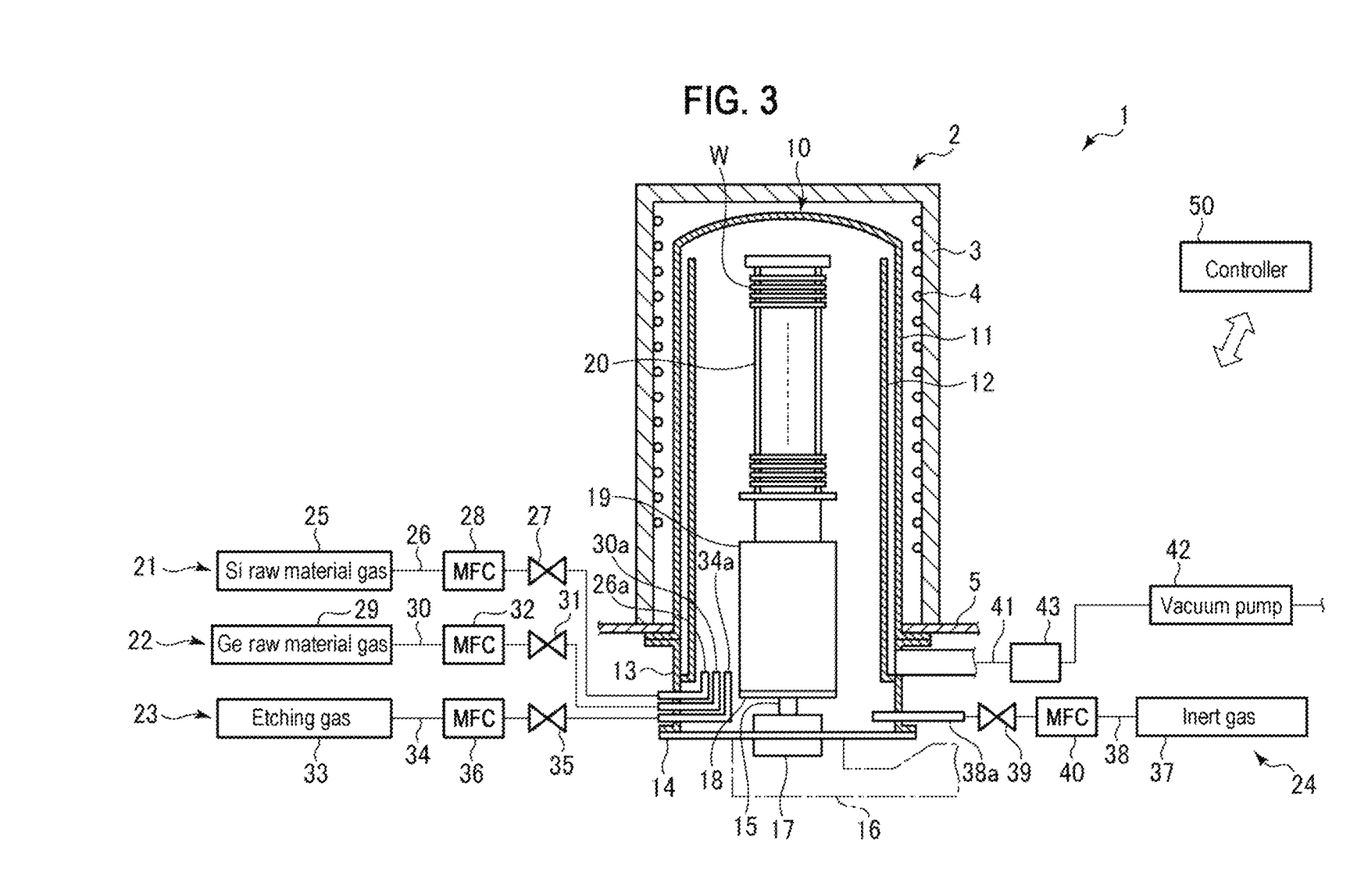
FIG. 3 is a longitudinal sectional view showing an example of a processing apparatus that can be used in implementing a recess filling method of the present disclosure.

Next, an example of a processing apparatus that can be used in implementing the recess filling method of the present disclosure will be described. FIG. 3 is a longitudinal sectional view showing a film forming apparatus as an example of the processing apparatus.

A film forming apparatus 1 includes a heating furnace 2 which is provided with a cylindrical insulating body 3 having a ceiling, and a heater 4 installed in an inner peripheral surface of the insulating body 3. The heating furnace 2 is installed on a base plate 5.

A processing container 10 is inserted into the heating furnace 2. The processing container 10 has a double tube structure, which is composed of an outer tube 11 with the top end thereof closed, and an inner tube 12 concentrically arranged inside the outer tube 11. Both the outer tube 11 and the inner tube 12 are made of, for example, quartz. In addition, the heater 4 is installed to surround the outer side of the processing container 10.

The outer tube 11 and the inner tube 12 are held at lower ends thereof by a cylindrical manifold 13 made of stainless steel or the like, respectively. A cap portion 14 is installed in a lower end opening portion of the manifold 13 to open and close the opening portion, thus hermetically sealing the opening portion.

A rotary shaft 15 passes through the center of the cap portion 14 to be rotatable in the hermetical state by, for example, a magnetic seal. A lower end of the rotary shaft 15 is connected to a rotating mechanism 17 of an elevation station 16 and an upper end thereof is fixed to a turntable 18. A quartz-made wafer boat 20 as a substrate holder configured to hold wafers which are substrates to be processed is mounted on the turntable 18 with a heat insulating tube 19 interposed between the wafer boat 20 and the turntable 18. The wafer boat 20 is configured to receive, for example, 50 to 150 sheets of wafers W which are stacked at predetermined pitches.

In addition, the elevation station 16 is moved up and down by a lifting mechanism (not shown) such that the wafer boat 20 can be loaded into or unloaded from the processing container 10. If the wafer boat 20 is loaded into the processing container 10, the cap portion 14 is brought into close contact with the manifold 13 so that a gap defined therebetween is air-tightly sealed.

Further, the film forming apparatus 1 includes: a Si raw material gas supply mechanism 21 configured to introduce a Si raw material gas into the processing container 10; a Ge raw material gas supply mechanism 22 configured to introduce a Ge raw material gas into the processing container 10; an etching gas supply mechanism 23 configured to introduce an etching gas into the processing container 10; and an inert gas supply mechanism 24 configured to introduce an inert gas used as a purge gas into the processing container 10. The combination of the Si raw material gas supply mechanism 21, the Ge raw material gas supply mechanism 22, the etching gas supply mechanism 23, and the inert gas supply mechanism 24 constitute a gas supply part.

The Si raw material gas supply mechanism 21 includes a Si raw material gas supply source 25, a Si raw material gas pipe 26 through which a film forming gas is introduced from the Si raw material gas supply source 25, and a Si raw material gas nozzle 26a connected to the Si raw material gas pipe 26 and installed to pass through a lower portion of the lateral wall of the manifold 13. The Si raw material gas nozzle 26a is made of quartz. A valve 27 and a flow rate controller 28 such as a mass flow controller are installed in the Si raw material gas pipe 26 to control a flow rate of the Si raw material gas flowing through the valve 27 and the flow rate controller 28.

The Ge raw material gas supply mechanism 22 includes a Ge raw material gas supply source 29, a Ge raw material gas pipe 30 through which a Ge raw material gas is introduced from the Ge raw material gas supply source 29, and a Ge raw material gas nozzle 30a made of quartz that is connected to the Ge raw material gas pipe 30 and is installed to pass through the lower portion of the lateral wall of the manifold 13. A valve 31 and a flow rate controller 32 such as a mass flow controller are installed in the Ge raw material gas pipe 30 to control a flow rate of Ge raw material gas flowing through the valve 31 and the flow rate controller 32.

The etching gas supply mechanism 23 includes an etching gas supply source 33, an etching gas pipe 34 through which an etching gas is introduced from the etching gas supply source 33, and an etching gas nozzle 34a made of quartz that is connected to the etching gas pipe 34 and is installed to pass through the lower portion of the lateral wall of the manifold 13. A valve 35 and a flow rate controller 36 such as a mass flow controller are installed in the etching gas pipe 34 to control a flow rate of the etching gas flowing through the valve 35 and the flow rate controller 36.

The inert gas supply mechanism 24 includes an inert gas supply source 37, an inert gas pipe 38 through which an inert gas is introduced from the inert gas supply source 37, and an inert gas nozzle 38a connected to the inert gas pipe 38 and installed to pass through the lower portion of the lateral wall of the manifold 13. A valve 39 and a flow rate controller 40 such as a mass flow controller are installed in the inert gas pipe 38.

As described above, the Si raw material gas supplied from the Si raw material gas supply mechanism 21 is not particularly restricted as long as it is Si-containing compounds to which the CVD method is applicable. For example, silane-based compounds and amino-silane-based compounds may be used as the Si raw material gas.

As described above, the Ge raw material gas supplied from the Ge raw material gas supply mechanism 22 is not particularly restricted as long as it is Ge-containing compounds to which the CVD method is applicable. For example, as described above, germane-based compounds and amino-germane-based compounds may be used as the Ge raw material gas.

As described above, the etching gas supplied from the etching gas supply mechanism 23 is not particularly restricted as long as it can remove silicon. Examples of the etching gas may include $Cl_2$, $HCl$, $F_2$, $Br_2$, $HBr$, or the like.

A nobble gas such as an $N_2$ gas or an Ar gas may be used as the inert gas supplied from the inert gas supply mechanism 23.

An exhaust pipe 41 is connected to an upper portion of the lateral wall of the manifold 13 in order to exhaust process gases from a gap defined between the outer tube 11 and the inner tube 12. The exhaust pipe 41 is connected to a vacuum pump 42 for exhausting the interior of the processing container 10. Further, a pressure control mechanism 43 including a pressure control valve and the like is installed in the exhaust pipe 41. In addition, the interior of the processing container 10 is exhausted by the vacuum pump 42 and an internal pressure of the processing container 10 is adjusted to a predetermined pressure by the pressure control mechanism 43.

Further, the film forming apparatus 1 includes a controller 50. The controller 50 includes a computer (CPU) for controlling respective components of the film forming apparatus 1, for example, various valves, mass flow controllers as flow rate controllers, a heater power supply, a driving mechanism such as a lifting mechanism or the like, a user interface including a keyboard for allowing an operator to enter commands for the management of the film forming apparatus 1 and a display for visually displaying operating states of the film forming apparatus 1, and a storage part that stores parameters for various processes that are executed in the film forming apparatus 1 or programs (namely, process recipes) for executing processes in respective components of the film forming apparatus 1 according to process conditions. If necessary, according to instructions inputted from the user interface, a certain process recipe is retrieved from the storage part and is executed by the computer. With this configuration, the recess filling method as described above is performed by the film forming apparatus 1 under the control of the computer. The process recipe is stored in the storage medium. The storage medium may be a hard disk, DVD, a semiconductor memory, or the like.

Hereinafter, process operations when the recess filling method described above is performed by the film forming apparatus 1 configured as above will be described. The following process operations are performed by the controller 50 based on the process recipes stored in the storage medium of the storage part.

First, for example, 50 to 150 sheets of semiconductor wafers W in each of which a recess such as a trench or hole is formed in an insulating film in a predetermined pattern as described above, are loaded on the wafer boat 20. The wafer boat 20 on which the wafers W are loaded is placed on the turntable 18 with the heat insulating tube 19 interposed between the wafer boat 20 and the turntable 18. Then, the elevation station 16 is moved up such that the wafer boat 20 is loaded into the processing container 10 through the opening portion formed below the processing container 10.

At this time, the heater 4 heats the inside of the processing container 10 in advance such that a temperature of the central portion (the central portion in the vertical direction) of the wafer boat 20 reaches a temperature suitable to form the amorphous silicon film, for example, a predetermined temperature ranging from 300 to 700 degrees C. In addition, the internal pressure of the processing container 10 is adjusted to fall within a range of 0.1 to 10 Torr (13.3 to 1,333 Pa). Subsequently, the valve 27 is opened to supply, for example, a $SiH_4$ gas as a Si raw material gas into the processing container 10 (the inner tube 12) through the Si raw material gas pipe 26 from the Si raw material gas supply source 25. Then, a process of forming the amorphous silicon film is carried out at a predetermined temperature ranging from 300 to 700 degrees C. while rotating the wafer boat 20. A flow rate of the raw material gas at this time is controlled to be a predetermined flow rate in the range of 50 to 5000 sccm by the flow rate controller 28. The formation of the amorphous silicon film is terminated by closing the valve 27 at the time when the amorphous silicon film is formed at a predetermined thickness to the extent that the recess is not completely filled.

Subsequently, the interior of the processing container 10 is exhausted through the exhaust pipe 41 by the vacuum pump 42. The valve 39 is opened to supply an inert gas such as an $N_2$ gas into the processing container 10 from the inert gas supply source 37 such that the interior of the processing container 10 is purged. The interior of the processing container 10 is kept at a predetermined temperature in the range of 200 to 500 degrees C. by the heater 4 and the internal pressure of the processing container 10 is kept at a predetermined value. Thereafter, the valve 39 is closed and the valve 35 is opened to supply a predetermined etching gas (for example, a $Cl_2$ gas) into the processing container 10 from the etching gas supply source 33 through the etching gas pipe 34. Thus, the silicon film remains only in the bottom portion of the recess in a V-shape or a U-shape. After a predetermined period of time, the valve 35 is closed and the etching process is terminated.

Thereafter, the interior of the processing container 10 is exhausted and purged by the same operation as described above. The interior of the processing container 10 is kept at a predetermined temperature in the range of 200 to 500 degrees C. by the heater 4. Subsequently, the valve 39 is closed and the valve 31 is opened to supply a Ge raw material gas (for example, a $GeH_4$ gas) into the processing container 10 (the inner tube 12) from the Ge raw material gas supply source 22 through the Ge raw material gas pipe 30. Thus, a Ge film is formed at the predetermined temperature ranging from 200 to 500 degrees C. At this time, both the valve 27 and the valve 31 may be opened to supply a Si raw material gas (for example, a $SiH_4$ gas) in addition to the Ge raw material gas (for example, the $GeH_4$ gas) into the processing container 10, thus forming a SiGe film.

Thus, as described above, the Ge film or the SiGe film may undergo the bottom-up growth from only the bottom portion where the amorphous silicon film exists. That is to say, the Ge film or the SiGe film may be selectively filled into the recess.

After a predetermined period of time, if the Ge film or the SiGe film is formed up to a predetermined height in the recess, the valve 31 (or both the valves 31 and 27) is closed and the film forming process is terminated. Thereafter, the interior of the processing container 10 is exhausted by the vacuum pump 42 through the exhaust pipe 41 and is purged by the inert gas supplied thereinto. Subsequently, the internal pressure of the processing container 10 is returned to atmospheric pressure and the elevation station 16 is moved down to unload the wafer boat 20 out of the processing container 10.

As described above, the film forming apparatus 1 can process a plurality of wafers at one time and can consecutively execute all the operations of the recess filling process inside the processing container 10. Accordingly, the throughput of the process is extremely high. In addition, from the viewpoint of further increasing the throughput, a temperature difference in respective operations may be minimized The actual conditions may be exemplified as follows:
The number of wafers: 150 sheets
Formation of Amorphous silicon film
   Temperature: 500 degrees C.
   Pressure: 2.0 Torr (267 Pa)
   Flow rate of $SiH_4$ gas: 1,000 sccm
Etching
   Temperature: 400 degrees C.

Pressure: 0.3 Torr (40 Pa)
Flow rate of $Cl_2$ gas: 1,000 sccm
Filling of Ge film
Temperature: 300 degrees C.
Pressure: 1.5 Torr (200 Pa)
Flow rate of $GeH_4$ gas: 700 sccm
Filling of SiGe film
Temperature: 350 degrees C.
Pressure: 1.5 Torr (200 Pa)
Flow rate of $GeH_4$ gas: 900 sccm
Flow rate of $SiH_4$ gas: 225 sccm <Experiment Example>

Next, the description will be made of Experimental example.

FIGS. 4A to 4D are SEM photographs showing cross-sections of a sample wafer in respective operations in Experiment example.

Figure 4A:
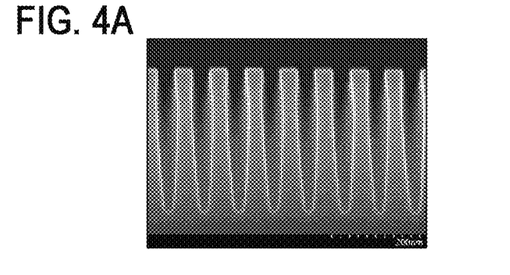
FIGS. 4A to 4D are SEM photographs showing cross-sections of a sample wafer in respective processes in Experimental example.

As shown in FIG. 4A, a sample wafer was prepared in which trenches having a gap width of 40 nm and a depth of 300 nm are formed in a predetermined pattern in a $SiO_2$ film formed on a Si base. A filling process was performed with respect to the sample wafer using the film forming apparatus 1 of FIG. 3.

Figure 4B:
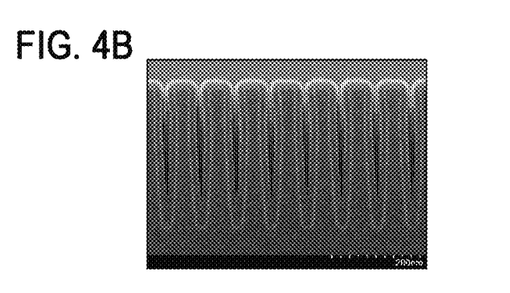

First, an amorphous silicon film was formed on the sample wafer using a $SiH_4$ gas as a Si raw material gas. At this time, under the condition that the wafer temperature is 500 degrees C., the internal pressure of the processing container is 2.0 Torr (267 Pa), and the flow rate of the $SiH_4$ gas is 1,000 sccm, the amorphous silicon film was formed at such a thickness as not to completely fill the respective trenches, as shown in FIG. 4B.

Figure 4C:
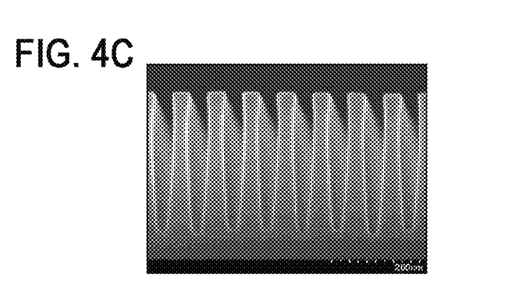

Subsequently, the amorphous silicon film was etched using a $Cl_2$ gas as an etching gas. At this time, under the condition that the wafer temperature is 400 degrees C., the internal pressure is 0.3 Torr (40 Pa), and the flow rate of the $Cl_2$ gas is 1000 sccm, the amorphous silicon film was formed to have a V-shape in the bottom portion of the respective trench, as shown in FIG. 4C.

Figure 4D:
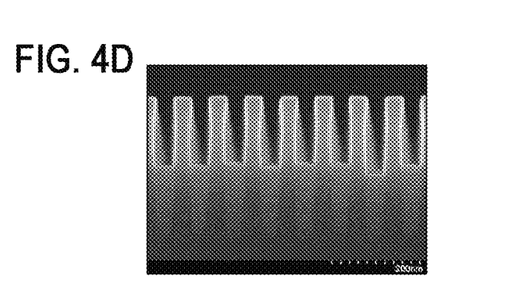

Subsequently, the filling of a Ge film was performed using a $GeH_4$ gas as a Ge raw material gas. Conditions used at this time are as follows: the wafer temperature is 300 degrees C., the internal pressure is 1.5 Torr (200 Pa), and the flow rate of the $GeH_4$ gas is 700 sccm. As a result, as shown in FIG. 4D, the Ge film has undergone a bottom-up growth from the amorphous silicon in the bottom portion of the respective trench. Thus, the Ge film has not been formed on the surface of the sample wafer and the lateral wall of the trench, and the Ge film was selectively filled into the trench. In addition, in spite of fine trenches, no defect such as voids was found in all the Ge films inside the trenches.

<Other Applications>

Although in the above, the embodiments of the present disclosure have been described, the present disclosure is not limited to the above embodiments but may be modified variously without departing from the scope thereof.

For example, although in the above embodiments, there has been described an example in which the method of the present disclosure is implemented using the vertical batch type apparatus, the present disclosure is not limited thereto. In some embodiments, the method of the present disclosure may be implemented using other various kinds of film forming apparatuses such as a horizontal batch type apparatus or a single-wafer type apparatus. In addition, although in the above embodiments, there has been described an example in which all the processes are performed by a single apparatus, some of the processes (for example, etching) may be performed by another apparatus.

Furthermore, while there has been described a case where the semiconductor wafer is used as a substrate to be processed, the substrate to be processed is not limited to the semiconductor wafer. For example, the substrate to be processed may be other substrates such as a glass substrate for a flat panel display, a ceramic substrate, and the like.

According to the present disclosure, a silicon film is formed on a surface of an insulating film having recesses such as trenches or holes formed therein at such a thickness as not to completely fill the respective recess. Subsequently, the silicon film is etched by an etching gas such that the silicon film remains only in a bottom portion of the recess. In such a state, when a germanium-based film is formed, the germanium-based film is selectively formed only on the silicon film existing in the bottom portion. This makes it possible for the germanium-based film to undergo a bottom-up growth from the bottom portion. It is therefore possible to selectively fill the recess with the germanium-based film. In addition, even for a fine recess, it is possible to fill the fine recess with the germanium-based film through the bottom-up growth, without causing voids.

While certain embodiments have been described, these embodiments have been presented by way of example only, and are not intended to limit the scope of the disclosures. Indeed, the embodiments described herein may be embodied in a variety of other forms. Furthermore, various omissions, substitutions, and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of filling a recess with a germanium-based film composed of germanium or silicon germanium in a substrate to be processed on which an insulating film having the recess formed therein is formed, the method comprising:
    forming a silicon film on a surface of the insulating film at a thickness as not to completely fill the recess;
    subsequently, etching the silicon film such that the silicon film remains only in a bottom portion of the recess; and
    subsequently, selectively growing the germanium-based film composed of germanium or silicon germanium on the silicon film remaining in the bottom portion of the recess and selectively filling the recess with the germanium-based film.

2. The method according to claim 1, wherein the silicon film is formed by a CVD method using a silicon-raw material gas, and the germanium-based film is formed by a CVD method using a germanium-raw material or a combination of the germanium-raw material gas gas and the silicon-raw material gas.

3. The method according to claim 2, wherein the silicon-raw material gas is a silane-based gas or an amino-silane-based gas.

4. The method according to claim 2, wherein the germanium-raw material gas is a germane-based gas or an amino-germane-based gas.

5. The method according to claim 1, wherein the etching the silicon film is formed by supplying an etching gas, which etches the silicon film, to the substrate to be processed.

6. The method according to claim 5, wherein the etching gas is one selected from a group consisting of $Cl_2$, HCl, $F_2$, $Br_2$ and HBr.

7. The method according to claim 1, wherein the forming a silicon film is performed in a state in which a temperature of the substrate to be processed falls within a range of 300 to 700 degrees C.

8. The method according to claim 1, wherein the etching the silicon film is performed in a state in which a temperature of the substrate to be processed falls within a range of 200 to 500 degrees C.

9. The method according to claim 1, wherein the selectively filling the recess with the germanium-based film is performed in a state in which a temperature of the substrate to be processed falls within a range of 200 to 500 degrees C.

10. A processing apparatus of filling a recess with a germanium-based film composed of germanium or silicon germanium in a substrate to be processed on which an insulating film having the recess formed therein is formed, the apparatus comprising:
   a processing container configured to receive the substrate to be processed;
   a gas supply part configured to supply a predetermined gas into the processing container;
   a heating mechanism configured to heat an interior of the processing container;
   an exhaust mechanism configured to exhaust the interior of the processing container to reduce an internal pressure of the processing container; and
   a control part configured to control the gas supply part, the heating mechanism and the exhaust mechanism,
   wherein the control part
   controls the exhaust mechanism to reduce the internal pressure of the processing container to a predetermined pressure;
   controls the heating mechanism to keep the interior of the processing container at a predetermined temperature;
   controls the gas supply part to supply a silicon-raw material gas into the processing container such that a silicon film is formed on a surface of the insulating film at a thickness as not to completely fill the recess;
   subsequently, controls the gas supply part to supply an etching gas into the processing container to etch the silicon film such that the silicon film remains only in a bottom portion of the recess; and
   subsequently, controls the gas supply part to supply a germanium-raw material gas or a combination of the germanium-raw material gas and the silicon-raw material gas into the processing container such that the germanium-based film composed of germanium or silicon germanium selectively grows on the silicon film that remains in the bottom portion of the recess.

11. The apparatus according to claim 10, wherein the processing container receives a substrate holder that holds plural sheets of the substrates to be processed, and the plural sheets of the substrates to be processed are processed inside the processing container.

12. A non-transitory computer-readable storage medium storing a program that operates on a computer and controls a processing apparatus,
   wherein the program, when executed, causes the computer to control the processing apparatus so as to perform the method of claim 1.

* * * * *